US006888203B2

(12) United States Patent
Liaw et al.

(10) Patent No.: US 6,888,203 B2
(45) Date of Patent: May 3, 2005

(54) POWER CHIP SET FOR A SWITCHING MODE POWER SUPPLY HAVING A DEVICE FOR PROVIDING A DRIVE SIGNAL TO A CONTROL UNIT UPON STARTUP

(75) Inventors: Chorng-Wei Liaw, Huwei Jen (TW); Hau-Luen Tien, Taipei (TW); Wei-Jye Lin, Chaujou Jen (TW); Ming-Jang Lin, Taiping Shiang (TW); Tian-Fure Shiue, Judung Jen (TW); Huang-Chung Cheng, Hsinchu (TW); Ching-Hsiang Hsu, Hsinchu (TW)

(73) Assignee: Analog and Power Electrics Corp., Hsinchu (TW)

( * ) Notice: Subject to any disclaimer, the term of this patent is extended or adjusted under 35 U.S.C. 154(b) by 225 days.

(21) Appl. No.: 10/361,071

(22) Filed: Feb. 7, 2003

(65) Prior Publication Data

US 2003/0117825 A1 Jun. 26, 2003

Related U.S. Application Data

(63) Continuation of application No. 09/882,848, filed on Jun. 15, 2001, now abandoned, which is a continuation of application No. 09/563,586, filed on May 3, 2000, now Pat. No. 6,259,618.

(51) Int. Cl.[7] .................... H01L 29/76; H01L 29/94; H01L 31/062; H01L 31/113; H01L 31/119
(52) U.S. Cl. .................... 257/401; 257/691; 363/147
(58) Field of Search ................ 257/401, 691; 363/147, 21.09, 49, 56.11

(56) References Cited

U.S. PATENT DOCUMENTS

| 4,811,075 A | * | 3/1989 | Eklund ................ 257/369 |
| 5,285,369 A | | 2/1994 | Balakrishnan ........... 363/49 |
| 5,313,381 A | * | 5/1994 | Balakrishnan .......... 363/147 |
| 5,378,903 A | * | 1/1995 | Otsuki et al. ............ 257/133 |
| 5,719,411 A | * | 2/1998 | Ajit .................. 257/132 |
| 6,125,046 A | | 9/2000 | Jang et al. ............... 363/49 |
| 6,600,205 B2 | * | 7/2003 | Carpenter et al. ......... 257/500 |

* cited by examiner

Primary Examiner—Sheila V. Clark
(74) Attorney, Agent, or Firm—Thomas, Kayden, Horstemeyer & Risley

(57) ABSTRACT

A power chip set for a switching mode power supply includes a high voltage chip and a control unit chip. The high voltage chip contains a switching power metal-oxide-semiconductor (MOS) transistor being turned on/off under control of an output signal from the control unit, and a junction field effect transistor (JFET) coupled between a drain of the switching power MOS transistor and a power terminal of the control unit to serve as a start up element for driving the control unit during initiation, in which the JFET has a negative threshold voltage and the absolute value thereof is equal to the voltage for driving the control unit. The JFET structure in the high voltage chip further includes a Zener diode for over voltage protection of the control unit. The high voltage chip further contains a current-sense power MOS transistor coupled with the drain of the switching power MOS transistor for detecting a drain current of the switching power MOS transistor. The chip set can be packaged into a power module.

6 Claims, 4 Drawing Sheets

POWER CHIP SET FOR A SWITCHING MODE POWER SUPPLY HAVING A DEVICE FOR PROVIDING A DRIVE SIGNAL TO A CONTROL UNIT UPON STARTUP

CROSS-REFERENCE TO RELATED APPLICATION

The present application is a continuation of U.S. patent application Ser. No. 09/882,848, filed Jun. 15, 2001, abandoned which is a continuation of U.S. patent application Ser. No. 09/563,586, filed May 3, 2000 (now U.S. Pat. No. 6,259,618, issued on Jul. 10, 2001).

FIELD OF THE INVENTION

The present invention relates to an integrated circuit (IC) of a switching mode power supply (SMPS), and more particularly to a power chip set for an SMPS.

BACKGROUND OF THE INVENTION

It is a principal concern of the cost to manufacture a power supply in selecting between power supply types to be used in particular application and the components selected to construct them. Since integrated circuit technology has advanced such that a majority of the complex switching mode circuits can be integrated on a single chip, switching mode power supplies have become cost competitive with much simpler linear power supplies.

A prior art flyback power supply with a voltage regulator is schematically shown in FIG. 1. In a power supply circuit 10, a full-wave bridge rectifier 12 accepts an AC power from a set of power input terminals 14, and a DC power is therefore supplied to a transformer 18 in association with a filter capacitor 16. The transformer 18 comprises a primary winding 20 and a pair of secondary windings 22 and 24. A capacitor 28 is charged through the winding 22 and a diode 26 such that a power supply output voltage is provided at a set of output terminals 30 of the power supply circuit 10. On the other hand, a capacitor 34 is charged through the winding 24 and a diode 32 to provide a feedback voltage, which is delivered to a pulse width modulator (PWM) 40 through a voltage divider consisting of resistors 52 and 54. An end of the winding 20 is connected to a high voltage switching transistor 38 in a regulator circuit 36, which is turned on/off under the control of a signal from the PWM 40. The control signal from the PWM 40 to a gate of the switching transistor 38 oscillates at a frequency with a duty cycle such that a preset output voltage is maintained between the set of output terminals 30 of the power supply circuit 10.

A high voltage power start up transistor 42 is used to start up the regulator circuit 36. When power is turned on, the transistor 42 is turned on and the capacitor 34 is charged to provide a line 50 with internal low voltage power. Once the voltage on the line 50 reaches a threshold voltage, the PWM 40 functions, and when the voltage on the line 50 reaches a specific threshold voltage, a transistor 46 is turned on. As a result, the threshold voltage from a voltage source 48 is connected to a gate of the transistor 42, and thus the transistor 42 is turned off. As shown in FIG. 1, a resistor 44 is connected to a drain of the transistor 42.

To overcome the inconveniences caused by the high voltage pins of a chip and the high voltage itself, Balakrishnan disclosed in U.S. Pat. No. 5,014,178 a high voltage power start up transistor directly connected to a drain of a high voltage switching transistor, while in U.S. Pat. No. 5,313,381 a feedback control signal and a bias supply voltage combined at a single pin with a metal-oxide-semiconductor (MOS) transistor, such as that proposed in U.S. Pat. No. 4,811,075 to Eklund. However, complicated circuits and expensive manufacturing processes are presented in these prior arts. In addition, it is desired a further integration and excellent performance for an SMPS circuit.

SUMMARY OF THE INVENTION

Therefore, an object of the present invention is to provide a power chip set for an SMPS.

Briefly, a chip set according to the present invention comprises a high voltage chip and a control unit chip, in which the high voltage chip contains a junction field effect transistor (JFET) connected to the control unit and served as its power start up element. The JFET has a negative threshold voltage and its absolute value is equal to the value of the voltage to start up the control unit.

It is one aspect of the present invention that the JFET further contains a Zener diode for over voltage protection to the power start up terminals of the control unit.

One advantage of the present invention resides in that the JFET is manufactured in a process compatible with the power MOS, and therefore the JFET and the high voltage switching power MOS transistor are integrated on a single chip.

Another advantage of the present invention resides in that the chip set is constituted of the high voltage chip and the control unit chip, such that expensive IC manufacturing process is avoided and a smaller chip area is obtained. The chip set can be packaged into a module.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 2:
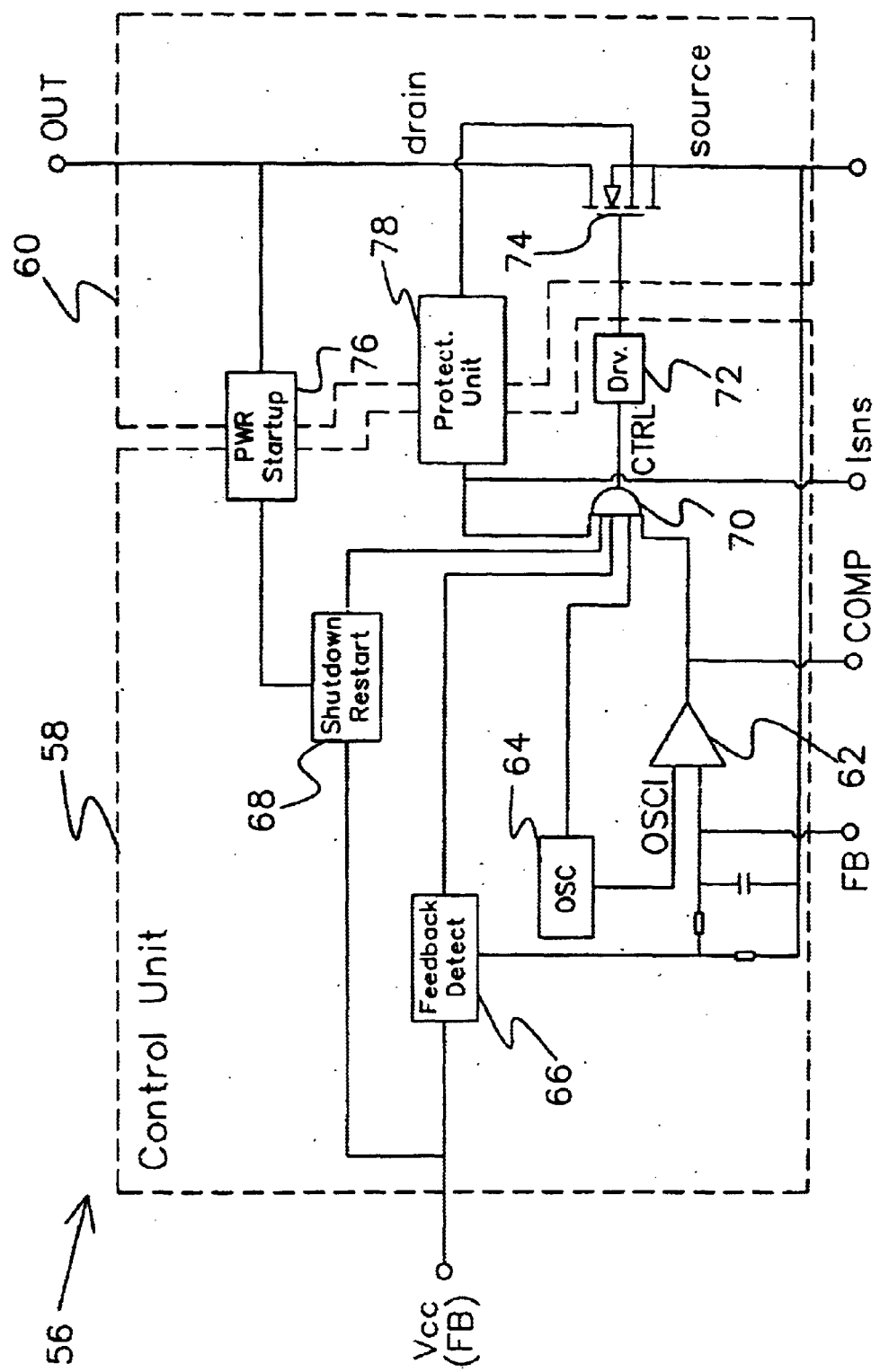
FIG. 2 is a functional block diagram of a power module according to an embodiment of the present invention.

One embodiment according to the present invention is shown in FIG. 2, in which a power module 56 for a SMPS comprises a chip set composed of a control unit chip 58 and a high voltage chip 60. The high voltage chip 60 contains high voltage circuit elements, while all control circuits contained in the control unit chip 58 being not applied with high voltage.

Figure 1:
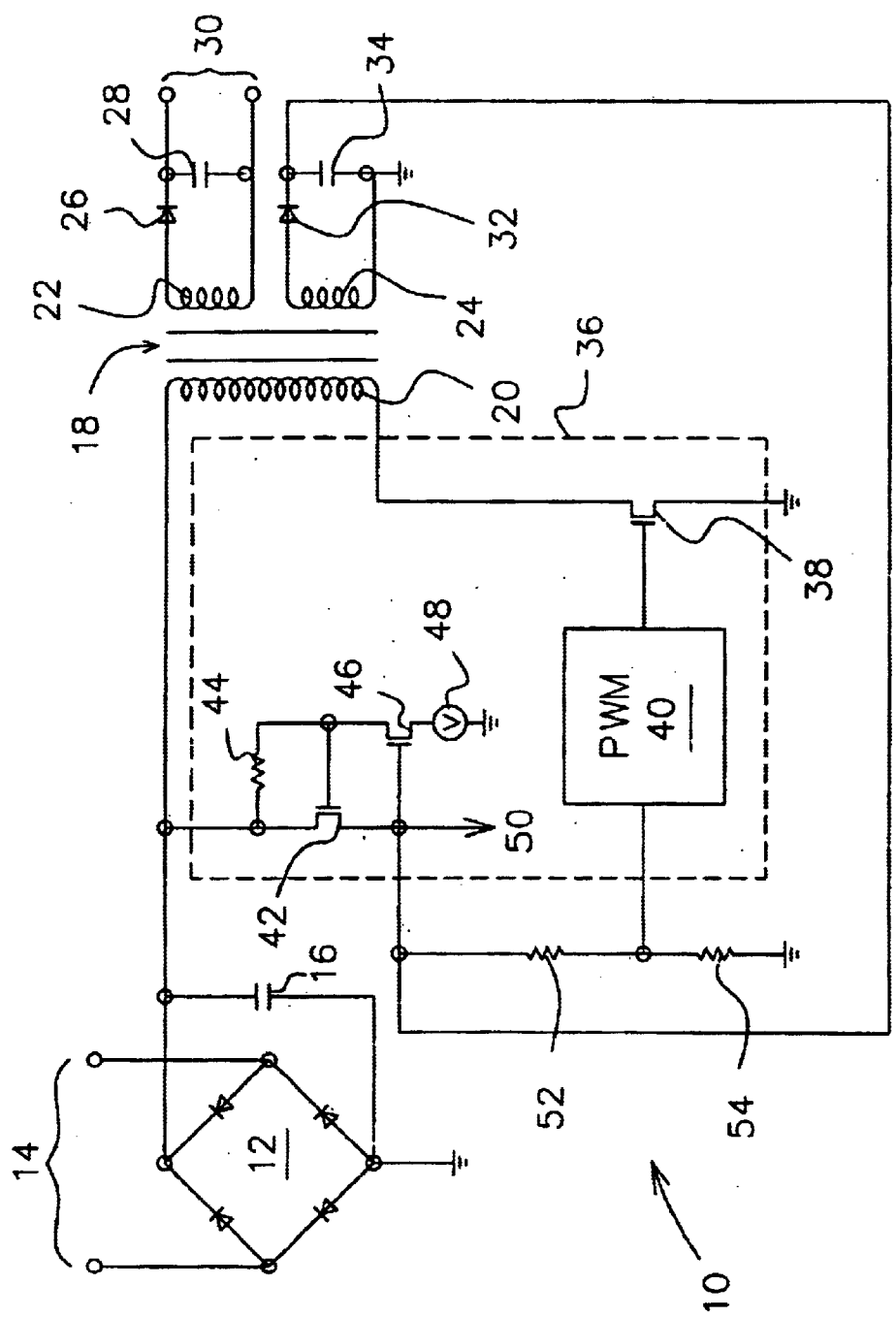
FIG. 1 is a schematic view showing a prior art flyback power supply circuit.

Provided in the control unit circuit 58, a pulse width modulation comparator 62 receives and compares two signals, i.e., a feedback signal FB and an oscillation signal OSCl form an oscillator 64, through its two input terminals respectively. As a result, an output oscillation signal COMP with a selected oscillation frequency and duty cycle is generated by the pulse width modulation comparator 62. The feedback signal FB is also connected to an over voltage and under voltage detection and feedback detection unit 66 whose output signal together with an output signal of a shutdown/auto restart unit 68, an output signal of the oscillator 64 and the output oscillation signal COMP from the pulse width modulation comparator 62 are inputted into an AND gate 70, from which a resultant control signal CTRL by logic decision is transmitted to a gate driver 72 to control ON/OFF state of a switching transistor 74. In addition to the switching transistor 74, the high voltage chip 60 further contains a power start up unit 76 and a current detection and protection unit 78 connected to the control unit circuit 58. The switching transistor 74 has a source connected to a system reference voltage, i.e., ground, and a drain connected to an output terminal OUT of the chip set 56, which is connected to the end of the primary winding 20 of the transformer 18 as shown in FIG. 1. When the SMPS of the present invention is turned on, a start up voltage power is provided through the power start up unit 76 to the control unit 58 for the initiation of the control unit 58. On the other hand, the current detection and protection unit 78 monitors the drain current of the switching transistor 74 and produce an output signal $I_{sns}$ which is also inputted into the AND gate 70 in the control unit 58 to the one of the decision factors of the control single CTRL such that a protection for the chip set 56 is further provided.

Figure 3:
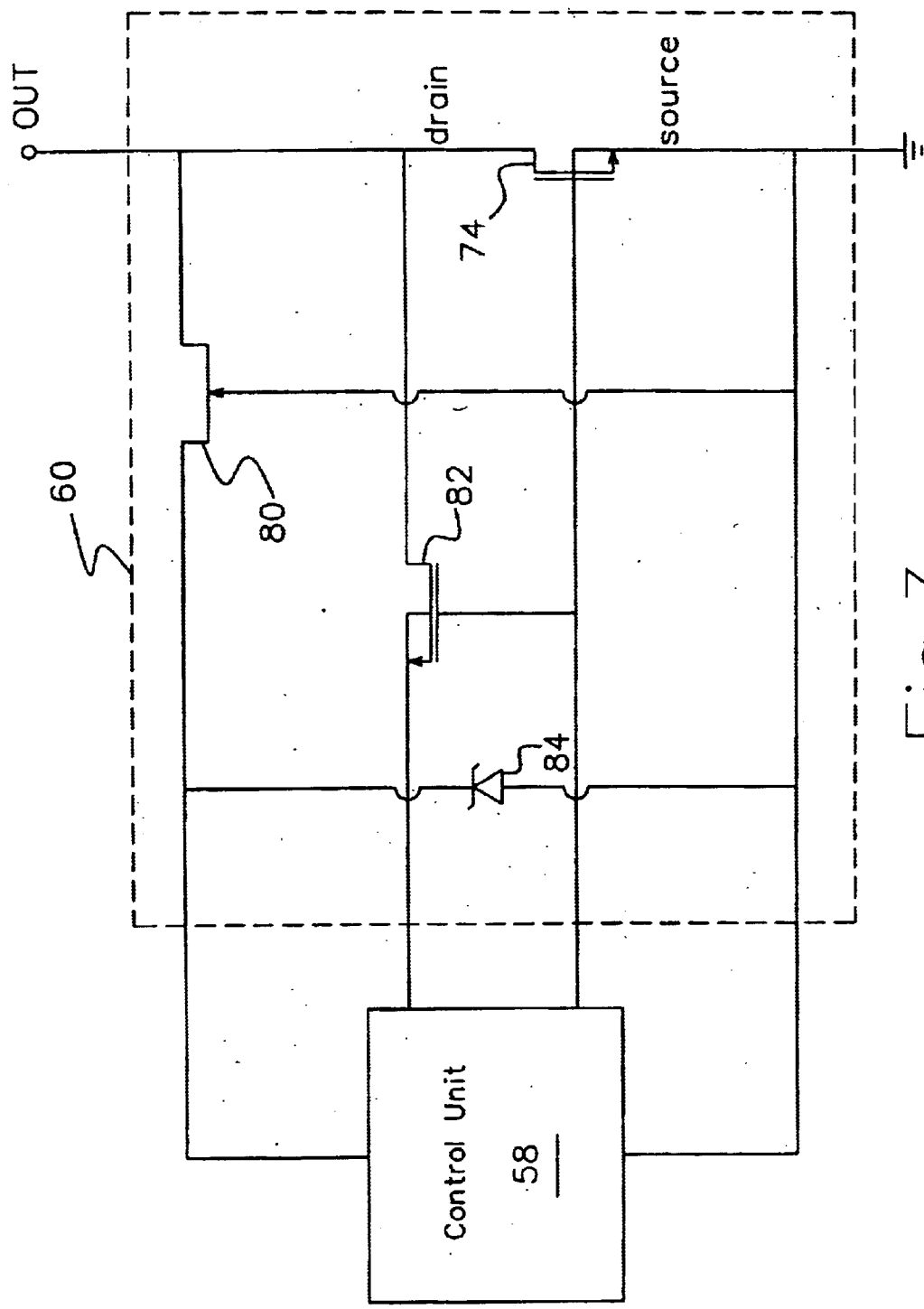
FIG. 3 is a circuit diagram of a high voltage chip according to the embodiment of the present invention.

FIG. 3 shows a circuit digram of the high voltage chip 60, in which a power MOS transistor 74 serves as the switching transistor being turned on/off under the control of the control signal outputted from the control unit 58. The source of the transistor 74 is grounded and the drain thereof is connected to the output terminal OUT of the chip set, which will be connected to the primary winding of the transformer 18 as shown in FIG. 1. A junction FET 80 is used as the start up element for the control unit 58, and is connected between the drain of the transistor 74 and the control unit 58 in order to provide the start up voltage power for driving the control unit 58 to be initiated. The threshold voltage of the junction FET 80 has a negative value, and the absolute value thereof is equal to the value of the power voltage doe driving the control unit 58. When the power of the SMPS is turned on, a start up voltage is applied to the control unit 58 from the junction FET 80 to initiate the control unit 58, and then the junction FET 80 is turned off. Another power MOS transistor 82 serves as current sense transistor to detect the drain current of the transistor 74, which has a drain connected to the drain of the transistor 74, a gate connected to the gate of the transistor 74 and a source connected to the control unit 58 Moreover, a Zener diode 84 for over voltage protection of the control unit 58 is coupled to the power terminal of the control unit 58.

Figure 4:
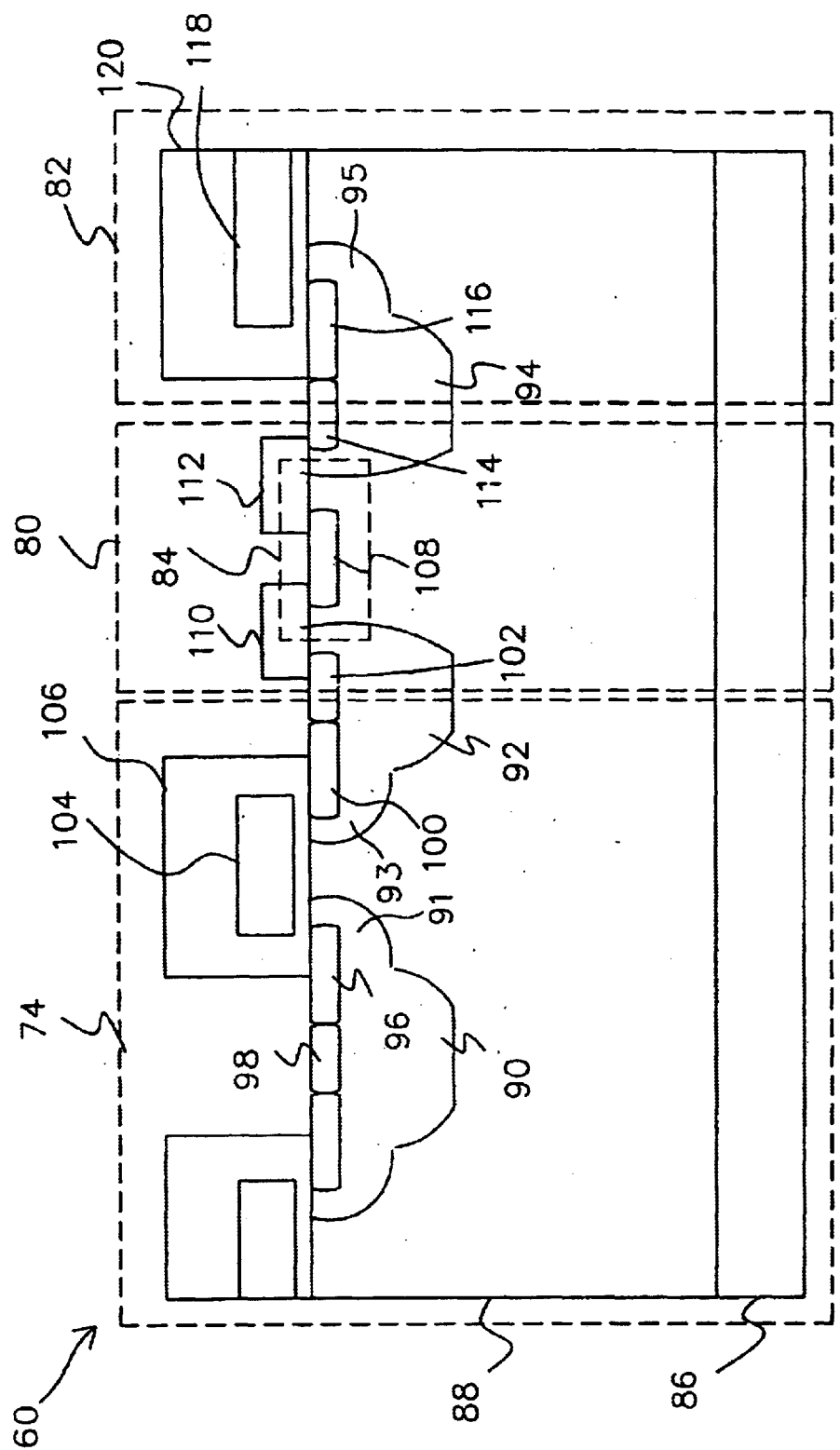
FIG. 4 is a cross sectional view of the high voltage chip according to the embodiment of the present invention.

The structure of the high voltage chip 60 is shown in FIG. 4, in which the junction FET is manufactured in a process compatible with that of MOS. In the chip 60, and N⁻ drift layer 88 is epitaxially grown on an N⁺ substrate 86, and then three P-wells 90, 92 and 94 are formed. P-base 91, N⁺ region 96 and P⁺ region 98 are formed on the well 90. P-base 93, N⁺ region 100 and P⁺ region 102 are formed on the well 92. P⁺ region 114 and N⁺ region 116 are formed on the well 94. A planar gate 104 is formed between the N⁺ regions 96 and 100 above the drift layer 88, and a dielectric layer 106 is formed between the gate 104 and the drift layer 88. A surface layer of the P-base 91 and 93 between the N⁺ regions 96 and 100 below the dielectric layer 106 is a channel controlled by the gate 104. Therefore, the substrate 86, the drift layer 88, the wells 90 and 92, the regions 96–102, the gate 104, and the dielectric layer 106 constitute the switching power MOS transistor 74 mentioned above. A surface portion of the drift layer 88 between the wells 92 and 94 is formed with N⁺ region 108, and insulation layers 110 and 112 are formed on the drift layer 88 between the N⁺ region 108 and P⁺ regions 102 and 114, respectively. Therefore, the substrate 86, the drift layer 88, the wells 92 and 94, the P⁺ regions 102 and 114, and the N⁺ region 108 constitute the junction FET 80 mentioned above, in which the structure is also known as static induction transistor (SIT). In the transistor 80, as shown in the figure, the Zener diode 84 comprises the drift layer 88, the N⁺ region 108 and the P⁻ wells 92 and 94. A planar gate 118 is produced on a surface among the P-base 95, the N⁺ regions 116 and the drift layer 88, and a dielectric layer 120 is formed between the gate 118 and the P-base 95. A surface of the P-base below the gate 118 is a gate channel. Therefore, the substrate 86 the drift layer 88, the P⁺ region 114, the N⁺ region 116, the well 94, the P-base 95, the gate 118 and the dielectric layer 120 constitute the current-sense transistor 82 mentioned above.

While the present invention has been described in conjunction with preferred embodiments therefor, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A power chip set for a switching mode power supply, comprising a high voltage chip, having a junction field effect transistor, a switching power MOS transistor, and a current sense transistor, and further comprising:

a N⁺ drift layer epitaxially grown on a N⁺ substrate forming a plurality of P⁻ wells;

a first P⁻ well having a first P⁻ base, a first N⁺ region and a first P⁺ region formed on said first well;

a second P⁻ well having a second P⁻ base, a second N⁺ region and a second P⁺ region formed on said second well;

a third P⁻ well having a third P⁻ base, a third N⁺ region and a third P⁺ region formed on said third well;

a first planar gate is formed on the first and second N⁺ regions or said first and second P⁻ wells, wherein said first planar gate is positioned above said N drift layer thus forming a first dielectric layer between the first planar gate and the N⁻ drift layer;

a first channel which is controlled by the first planar gate and is comprised of a surface layer of the first and second P⁻ bases between the first and second N⁺ regions below the first dielectric layer;

wherein the switching power MOS transistor is comprised of the N⁻ substrate, the N⁻ drift layer, the first and second P⁻ wells, the first and second P⁻ bases, the first and second N⁺ regions, the first and second P⁺ regions, the first planar gate and the first dielectric layer;

a surface portion of the N⁻ drift layer between the second and third P⁻ wells is formed with a second N⁺ region, a first and second insulation layer formed on the N⁻ drift layer between the second N⁺ region and the second and third P⁺ regions;

wherein the junction field effect transistor is comprised of the N⁺ substrate, the N⁻ drift layer, the second and third P⁻ wells, the second and third P⁺ regions, the second N⁺ region, and a Zener diode, wherein the Zener diode is comprised of the N⁻ drift layer, the second N⁺ region and the second and third P⁻ wells;

a second planar gate is formed on the third P⁻ base, the third N⁺ region and the N⁻ drift layer, thus forming a second dielectric layer between the second planar gate and the third P⁻ base;

a second channel which is controlled by the second planar gate is comprised of a surface of the third P⁻ base below die second planar gate;

wherein a current sense transistor is comprised of the N⁺ substrate, the N⁻ drift layer, the third P⁺ region, the third N⁺ region, the third P⁻ well, the third P⁻ base, the second planar gate, and the second dielectric layer.

2. A power chip set for a switching mode power supply, comprising a high voltage chip, having a N⁻ drift layer epitaxially grown on a N⁺ substrate; a plurality of P³¹ wells; a plurality of P⁻ bases, P⁺ regions, and N⁺ regions formed on said P⁻ wells; and a plurality of planar gates, comprising a junction field effect transistor, a switching power MOS transistor, and a current sense transistor.

3. The power chip set of claim 2, wherein the switching power MOS transistor is comprised of the N⁺ substrate, the N⁻ drift layer, a first and second P⁻ well, a first and second P⁻ base, a first and second N⁺ region, a first and second P⁺ region, and a first planar gate; and further comprising:

a first dielectric layer formed between the first planar gate and the N⁻ drift layer; and a first channel which is controlled by the first planar gate and is comprised of a surface layer of the first and second P⁻ bases between the first and second N⁺ regions below the first dielectric layer.

4. The power chip set of claim 2, wherein the junction field effect transistor is comprised of the N⁺ substrate, the N⁻ drift layer, a second and third P⁻ well, a second and third P⁺ region, a second N⁺ region, and a Zener diode; and further comprising:

a first and second insulation layer is formed on the N⁻ drift layer between the second N⁺ region and the second and third P⁺ region;

a surface portion of the N⁻ drift layer between the second and third P⁻ wells is formed with a second N⁺ region; and the Zener diode is comprised of the N⁻ drift layer, the second N⁺ region and the second and third P⁻ wells.

5. The power chip set of claim 2, wherein the current sense transistor is comprised of the N⁺ substrate, the N⁻ drift layer, a third P⁺ region, a third N⁺ region, a third P⁻ well, a third P⁻ base, and a second planar gate, and further comprising:

a second dielectric layer is formed between the second planar gate and the third P⁻ base; and a second channel which is controlled by the second planar gate is comprised of a surface of the third P⁻ base below the second planar gate.

6. The power chip set of claim 8, wherein the current sense transistor is comprised of the N⁺ substrate, N⁻ the drift layer, a third P⁺ region, a third N⁺ *a third N⁺* region, a third P⁻ *well, a third P⁻* base, and a second planar gate, and furter comprising:

a second dielectric layer is formed between the second planar gate and the third P⁻ base; and a second channel which is controlled by the second planar gate is comprised of a surface of the third P⁻ base bellow the second planar gate.

* * * * *